United States Patent
Zhou et al.

(10) Patent No.: US 12,205,960 B2
(45) Date of Patent: Jan. 21, 2025

(54) ARRAY SUBSTRATE, CONTROL METHOD THEREOF, AND DISPLAY PANEL

(71) Applicant: HKC CORPORATION LIMITED, Shenzhen (CN)

(72) Inventors: Mancheng Zhou, Shenzhen (CN); Yuanping Zhang, Shenzhen (CN); Shuang Wang, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 254 days.

(21) Appl. No.: 18/069,562

(22) Filed: Dec. 21, 2022

(65) Prior Publication Data
US 2023/0402466 A1 Dec. 14, 2023

(30) Foreign Application Priority Data
Jun. 13, 2022 (CN) .......................... 202210662625

(51) Int. Cl.
*G02F 1/1368* (2006.01)
*H01L 27/12* (2006.01)

(52) U.S. Cl.
CPC .......... *H01L 27/124* (2013.01); *G02F 1/1368* (2013.01)

(58) Field of Classification Search
CPC .................................................. G02F 1/1368
See application file for complete search history.

(56) References Cited

U.S. PATENT DOCUMENTS

| | | | |
|---|---|---|---|
| 2015/0248149 A1* | 9/2015 | Yamazaki | G06F 1/263 |
| | | | 361/679.27 |
| 2016/0111055 A1* | 4/2016 | Na | G09G 3/3666 |
| | | | 345/94 |
| 2016/0246146 A1* | 8/2016 | Yao | G02F 1/136286 |
| 2018/0090089 A1* | 3/2018 | Cui | G09G 3/3677 |

FOREIGN PATENT DOCUMENTS

| CN | 104345513 A | 2/2015 |
|---|---|---|
| CN | 105572932 A | 5/2016 |
| CN | 106030451 A | 10/2016 |
| CN | 106205449 A | 12/2016 |
| CN | 108231029 A | 6/2018 |

* cited by examiner

*Primary Examiner* — Sang V Nguyen
(74) *Attorney, Agent, or Firm* — Hodgson Russ LLP

(57) ABSTRACT

An array substrate includes a plurality of TFT switches arranged in an array and a scan driver circuit. In each row of TFT switches, a plurality of TFT switches form a first group of switches, and the rest of the TFT switches form a second group of switches. The scan driver circuit outputs first and second scan signals for each row of the TFT switches. The first group of switches receives the first scan signal, and the second group of switches receives the second scan signal. When a static image is displayed, the first scan signal or the second scan signal is an off signal to turn off the first or second group of switches.

17 Claims, 3 Drawing Sheets

ARRAY SUBSTRATE, CONTROL METHOD THEREOF, AND DISPLAY PANEL

CROSS-REFERENCE TO RELATED APPLICATIONS

This application claims priority to Chinese Patent Application No. 202210662625.9, filed Jun. 13, 2022, the entire contents of which are incorporated herein by reference.

FIELD OF TECHNOLOGY

The application relates to the field of display panels, in particular to an array substrate, a control method thereof and a display panel.

BACKGROUND

At present, LCD displays are developing towards higher resolution, higher display quality and larger size. When TFT-LCD (thin film transistor liquid crystal display) is driven by one-by-one (progressive scanning). When a Gn signal is high, the TFT in the corresponding row is turned on, and data in column direction can be written into pixels. Each sub-pixel includes liquid crystal capacitor Clc and storage capacitor Cst. One end of Cst and Clc is a pixel electrode, and another end of Cst and Clc is a common electrode (VCOM). Because liquid crystal charging and discharging is the architecture of capacitor, if DC (direct current) circuit is used for driving, residual charges are inevitably generated at the two ends of the capacitor, and there will be afterimages on the display. In order to avoid this phenomenon, DC is changed to AC (alternating current), and liquid crystal works by different voltages, different rotations and different light transmittance. At present, polarity inversion (point inversion) is adopted to control the voltage at both ends of liquid crystal, and the voltage inversion at both ends of liquid crystal is accompanied by the switching of positive and negative polarities at both ends of liquid crystal capacitor and storage capacitor. However, when displaying a static image, there is unnecessary power loss on the storage capacitor and liquid crystal capacitor due to the switching of positive and negative polarities of the static image capacitor, resulting in high power consumption of the display panel.

The above information disclosed in the Background is only for enhancement of understanding of the background of the present application and therefore it may include information that does not constitute prior art known to a person of ordinary skill in the art.

SUMMARY

There are provided an array substrate, a control method thereof and a display panel according to embodiments of the present application. The technical solution is as below:

According to a first aspect of the present application, there is provided an array substrate including a plurality of TFT switches arranged in an array and a scan driver circuit. In each row of the TFT switches, a plurality of the TFT switches form a first group of switches, and the rest of the TFT switches form a second group of switches. The scan driver circuit outputs a first scan signal and a second scan signal corresponding to each row of the TFT switches. The first group of switches receives the first scan signal, and the second group of switches receives the second scan signal. And when a static image is displayed, the first scan signal or the second scan signal is an off signal to turn off the first group of switches or the second group of switches.

According to a second aspect of the present application, there is provided a control method of an array substrate including a plurality of TFT switches arranged in an array. In each row of the TFT switches, a plurality of the TFT switches form a first group of switches, and the rest of the TFT switches form a second group of switches. The method includes:

acquiring a dynamic and static types of a current display image;

sending a first scan signal to a first group of switches and sending a second scan signal to a second group of switches at the same time when the display image is a static image; wherein the first scan signal or the second scan signal is an off signal to turn off the first group of switches or the second group of switches.

According to a third aspect of the present application, there is provided a display panel including a color film substrate and the above array substrate arranged by cell assembling, and a liquid crystal layer sandwiched between the color film substrate and the array substrate.

It should be understood that the above general description and the following detailed description are exemplary only and are not limiting to the present application.

BRIEF DESCRIPTION OF THE DRAWINGS

The above and other objects, features and advantages of the present application will become more apparent by describing exemplary embodiments thereof in detail with reference to the accompanying drawings.

DETAILED DESCRIPTION OF THE EMBODIMENTS

Figure 1:
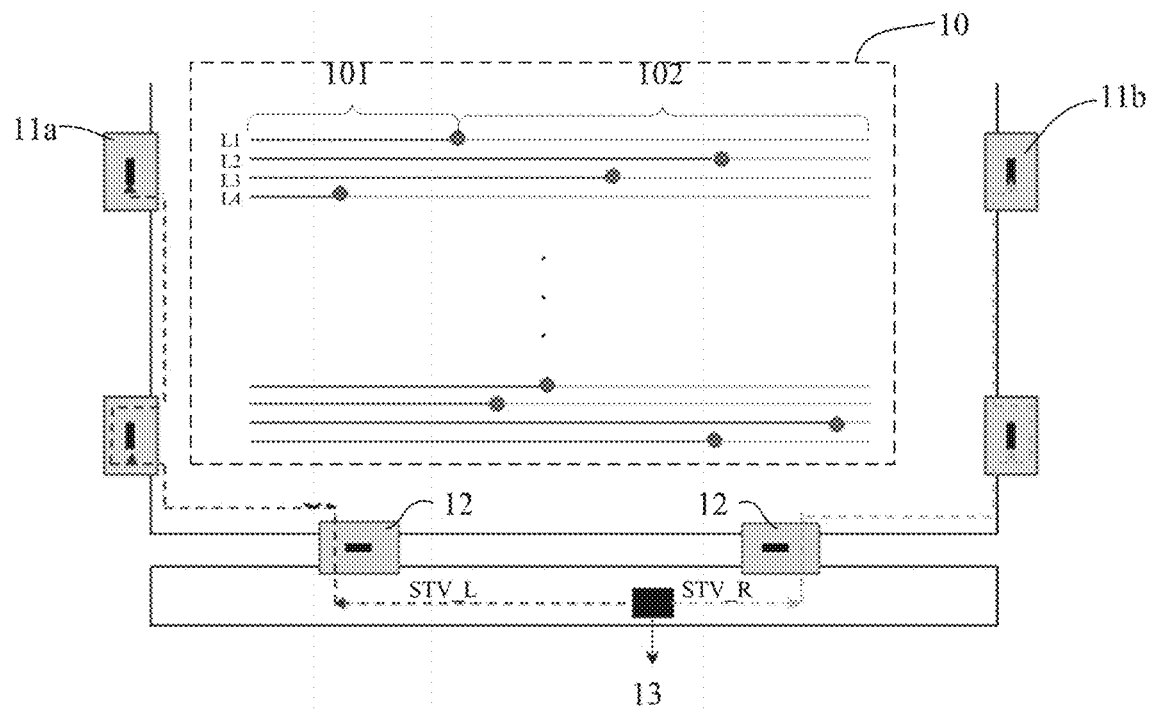
FIG. 1 is a schematic diagram of an array substrate shown according to a first embodiment.

Although the present application can readily be embodied in different forms of embodiment, however, only some of the specific embodiments are shown in the drawings and will be described in detail in the description, while it is understood that the description is to be regarded as an exemplary illustration of the principles of the present application and is not intended to limit the present application to those described herein.

Thus, one feature pointed out in the description is intended to illustrate one of the features of one embodiment of the present application and is not intended to imply that each embodiment of the present application must possess the illustrated feature. In addition, it should be noted that many features are described in the description. Although certain features may be combined to illustrate a possible system design, these features may also be used for other unspecified combinations. Therefore, unless otherwise stated, the illustrated combinations are not intended to be limiting.

In the embodiments illustrated in the drawings, indications of direction (such as up, down, left, right, front and back) are used to explain that the structure and movement of the various elements of the present application are not absolute but relative. These descriptions are appropriate when these elements are in the positions shown in the drawings. If the description of the positions of the element changes, the indications of the directions change accordingly.

Exemplary embodiments will now be described more comprehensively with reference to the accompanying drawings. However, the exemplary embodiments can be implemented in a variety of forms and should not be construed as being limited to the examples set forth herein. Rather, these exemplary embodiments are provided so that the description of the present application will be more comprehensive and complete, and the concept of exemplary embodiments will be fully connected to those skilled in the art. The accompanying drawings are only schematic illustrations of the present application and are not necessarily drawn to scale. Like reference signs in the drawings denote identical or similar parts and thus repetitive descriptions thereof will be omitted.

The preferred embodiments of the present application are further elaborated below in conjunction with the accompanying drawings of the description.

First Embodiment

An embodiment provides an array substrate, which includes a TFT array, a scan driver (gate driver) circuit and a data driver (source driver) circuit. The scan driver circuit and the data driver circuit both are connected to TFT switches on the array substrate. Schematically, the array substrate includes a substrate, liquid crystal pixel electrodes arranged on the substrate in a matrix form, data lines and scan lines arranged between rows and columns of the liquid crystal pixel electrodes. The data lines are connected to the data driver circuit, and the scan lines are connected to the scan driver circuit. Usually, one data line correspondingly connects and controls a column of liquid crystal pixel electrodes, and one scan line correspondingly connects and controls a row of liquid crystal pixel electrodes. A source is connected to each liquid crystal pixel electrode, a drain is provided corresponding to each source, the drain is connected to the corresponding data line, and a gate is provided corresponding to each pair of sources and drains, and the gate is connected to the corresponding scan line. The source, the drain and the gate constitute a TFT switch.

During the operation of the array substrate, the data line is used for transmitting video data signal in the data driver circuit to the drain of the TFT switch to control a voltage of the liquid crystal pixel electrode. The scan line is used for transmitting the scan driver signal in the scan driver circuit to the gate of the TFT switch, thereby controlling on and off of the TFT switch.

During the operation of the liquid crystal display device, for a frame, the data driver circuit transmits a video data signal to the drain through the data line. The scan driver circuit controls gates in each row to be turned on one after another according to Clock Pulse Vertical (PVC), and outputs a scan signal to the scan line one by one to enable the TFT switch to be turned on row by row, so that the data driver circuit deposits the corresponding data voltage to the pixel electrode to form different levels of grayscale voltages, thus achieving each frame image display.

Referring to FIG. 1, FIG. 1 is a schematic diagram of an array substrate 100 shown according to the first embodiment. Specifically, the array substrate 100 in this embodiment includes a plurality of TFT switches arranged in an array and a scan driver circuit. The scan driver circuit outputs scan signals to TFT switches in each row. In each row of TFT switches, a plurality of TFT switches constitute a first group of switches 101, and the remaining TFT switches constitute a second group of switches 102. The scan driver circuit outputs a first scan signal and a second scan signal corresponding to each row of the TFT switches. The first group of switches 101 receives the first scan signal, and the second group of switches 102 receives the second scan signal. When a static image is displayed, the first scan signal or the second scan signal is an off signal to turn off the first group of switches 101 or the second group of switches 102.

Herein, the number of TFTs per row in the TFT array 10 is not limited. In FIG. 1, L1, L2, L3, L4 . . . denote a row of TFT switches in the TFT array 10, respectively. In each row of TFT switches, a plurality of TFT switches included in the first group of switches 101/the second group of switches 102 may not be continuously arranged or may be continuously arranged. For example, the first group of switches 101 includes a first TFT switch, a third TFT switch, a fifth TFT switch, The second group of switches 102 includes a second TFT switch, a fourth TFT switch and a sixth ITT switch.

In an example, a number of TFT switches included in the first group of switches 101 and a number of TFT switches included in the second group of switches 102 are continuously arranged. Specifically, assuming that there are M+N TFT switches in each row, the front M TFT switches constitute the first group of switches 101 and the rear N TFT switches constitute the second group of switches 102 in an arrangement direction of each row of TFT switches. Both M and N are positive integers. M and N can be equal or unequal. In FIG. 1, the L1, L2, L3, L4 rows of TFT switches each have a black dot indicating a demarcation point between the first group of switches 101 and the second group of switches 102. It can be seen that the demarcation points in the first group of switches 101 and the second group of switches 102 in each row of TFT switches are al different positions.

Accordingly, a row of TFT switches is controlled by two scan lines, respectively. For example, a scan driver circuit is connected to the gates of all the TFT switches in the first group of switches 101 through the first scan line for supplying the first scan signal to all the TFT switches in the first group of switches 101. The scan driver circuit is connected to the gates of all the TFT switches in the second group of switches 102 through the second scan line for supplying the second scan signal to all the TFT switches in the second group of switches 102. It is therefore understood that all the TFT switches in the first group of switches 101 are turned on/off simultaneously. All TFT switches in the second group of switches 102 are turned on/off simultaneously.

In the TFT array 10, there are a plurality of rows of TFT switches. Each row has the first group of switches 101 and the second group of switches 102, and the number of TFT included in the first group of switches 101 of each row may be equal or unequal. The number of TFT included in the second group of switches 102 in each row may be equal or unequal. This is not limited here.

A first scan driver circuit 11a and a second scan driver circuit 11b are provided corresponding to each row of TFT switches. The array substrate 100 also includes a timing control circuit 13. The timing control circuit 13 is connected to the first scan driver circuit 11a to control the first scan driver circuit 11a to output the first scan signal. The timing control circuit 13 is connected to the second scan driver circuit 11b to control the second scan driver circuit 11b to output a second scan signal.

The first scan driver circuit 11a and the second scan driver circuit 11b may both be Gate IC and may both be gate driver circuits. In an example of the Gate IC, the Gate IC accepts STV and CLK signals transmitted by TCON and generates corresponding scan signals. In the embodiment, each row of TFT switches corresponds to a first Gate IC and a second Gate IC. Since the Gate IC can output multiple sets of scan driver signals, the first Gate IC can provide the first scan signal for the first group of switches 101 in a plurality of rows. The second Gate IC may provide the second scan signal for the second group of switches 102 in a plurality of rows.

Figure 2:
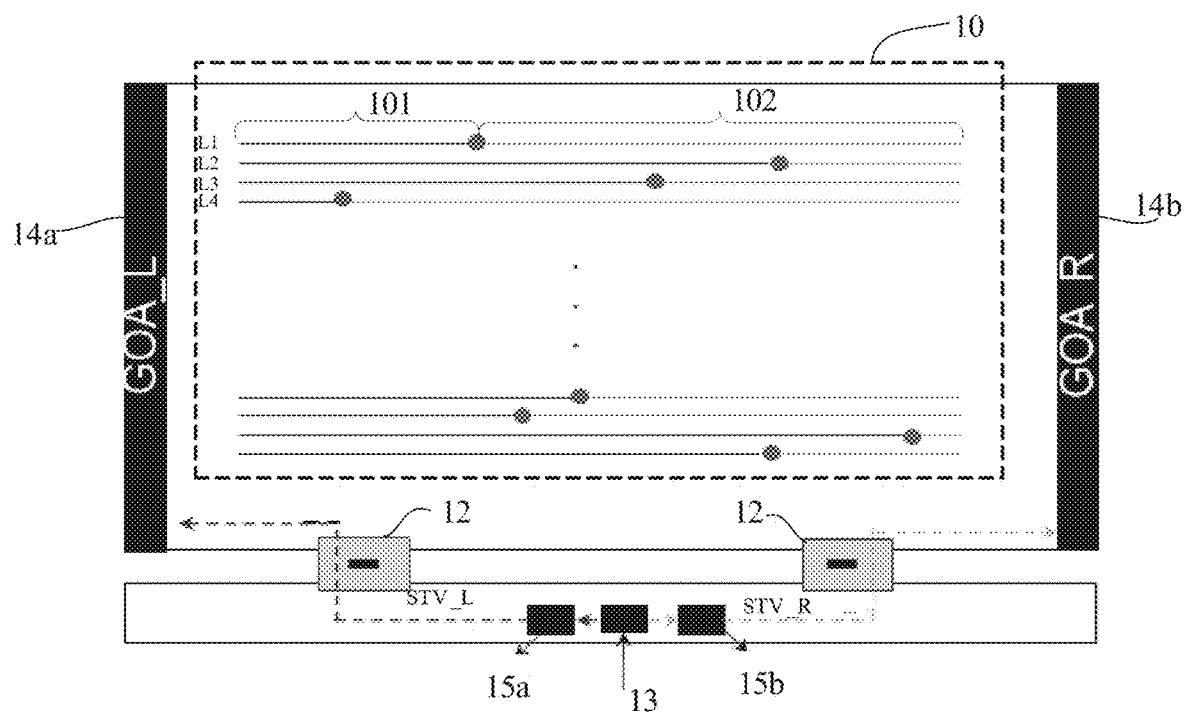
FIG. 2 is a schematic diagram of another array substrate shown according to the first embodiment.

FIG. 2 is a schematic diagram of another array substrate 100 shown according to the first embodiment. In another example, when the first scan driver circuit 11a is a first gate driver circuit 14a and the second scan driver circuit 11b is a second gate driver circuit 14b, both the first gate driver circuit 14a and the second gate driver circuit 14b include a level boost circuit. A level boost circuit 15a of the first gate driver circuit 14a is connected to a second terminal of the fourth switch transistor T4 to receive a first start control signal STV_L. A level boost circuit 15b of the second gate driver circuit 14b is connected to a second terminal of the first switch transistor T1 to receive a second start control signal STV_R.

The STV signal is a start control signal, which is usually sent by a timing controller. The timing controller controls whether the scan driver circuit outputs a scan signal by sending the STV signal to the scan driver circuit. For example, the STV signal is a high-level pulse. When the STV signal is received by the scan driver circuit, the scan signal is output as a clock signal. When the STV signal is not received by the scan driver circuit, the scan driver circuit does not output the scan signal. Therefore, whether the corresponding scan driver circuit outputs the scan signal can be controlled in the present application by controlling the presence or absence of the STV signal.

In related art, the timing controller only outputs a start control signal, therefore, in order to enable the timing controller to provide a start control signal for the first scan driver circuit 11a and the second scan driver circuit 11b according to the requirements of the present application, the present application has modified the timing control circuit 13. Please refer to FIG. 3, which is a circuit schematic diagram of the timing control circuit 13 in the first embodiment. The timing control circuit 13 includes a timing controller 132, a start signal generating unit 131 (corresponding to the STV unit in FIG. 3), a first switch transistor T1, a second switch transistor T2, a third switch transistor T3, and a fourth switch transistor T4. The controlled ends of the first switch transistor T1, the second switch transistor T2, the third switch transistor T3 and the fourth switch transistor T4 are electrically connected to the timing controller 132. A first terminal of the first switch transistor T1 is connected to the start signal generating unit 131, and a second terminal of the first switch transistor T1 outputs the second start control signal STV_R to the second scan driver circuit 11b. A first terminal of the second switch transistor T2 is connected to the second terminal of the first switch transistor T1, and a second terminal of the second switch transistor T2 is grounded. A first terminal of the fourth switch transistor T4 is connected to the start signal generating unit 131, and a second terminal of the fourth switch transistor T4 outputs the first start control signal STV_L, to the first scan driver circuit 11a. A first terminal of the third switch transistor T3 is connected to the second terminal of the fourth switch transistor T4, and a second terminal of the third switch transistor T3 is grounded. A polarity of the first switch transistor T1 is the same as a polarity of the fourth switch transistor T4 and is opposite to a polarity of the second switch transistor T2. The polarity of the fourth switch transistor T4 is opposite to that of the third switch transistor T3. It can be seen that the timing controller 132 controls the first switch transistor T1, the second switch transistor T2, the third switch transistor T3 and the fourth switch transistor T4 of the timing control circuit 13 to be turned on and off. Then the first timing control circuit 13 controls the start signal generating unit 131 to generate a start control signal.

In an example, the first switch transistor T1 and the fourth switch transistor T4 are NMOS transistors, and the second switch transistor T2 and the third switch transistor T3 are PMOS transistors. Alternatively, the first switching transistor T1 and the fourth switching transistor T4 may be NPN-type transistors, and the second switching transistor T2 and the third switching transistor T3 may be PNP-type transistors.

The timing controller 132 simultaneously outputs a first control signal to the controlled end of the first switch transistor T1 and the controlled end of the second switch transistor T2, and since the polarities of the first switch transistor T1 and the second switch transistor T2 are opposite, one of the first switch transistor T1 and the second switch transistor T2 enters an off state and the other of the first switch transistor T1 and the second switch transistor T2 enters an on state. The situation that the first switch transistor T1 and the second switch transistor T2 are simultaneously turned on or turned off is avoided. Similarly, the timing controller simultaneously outputs the second control signal to the controlled end of the third switch transistor T3 and the controlled end of the fourth switch transistor T4, and since the polarities of the third switch transistor T3 and the fourth switch transistor T4 are opposite, one of the third switch transistor T3 and the fourth switch transistor T4 enters the off state, and the other of the third switch transistor T3 and the fourth switch transistor T4 enters the on state. The situation that the third switch transistor T3 and the fourth switch transistor T4 are simultaneously turned on or turned off is avoided.

Figure 3:
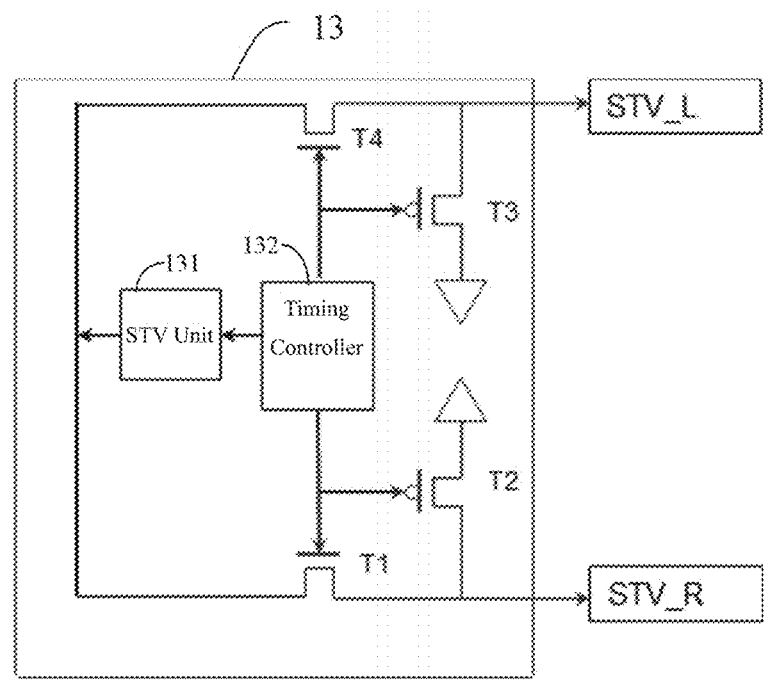
FIG. 3 is a circuit diagram of a timing control circuit in the first embodiment.
Figure 4:
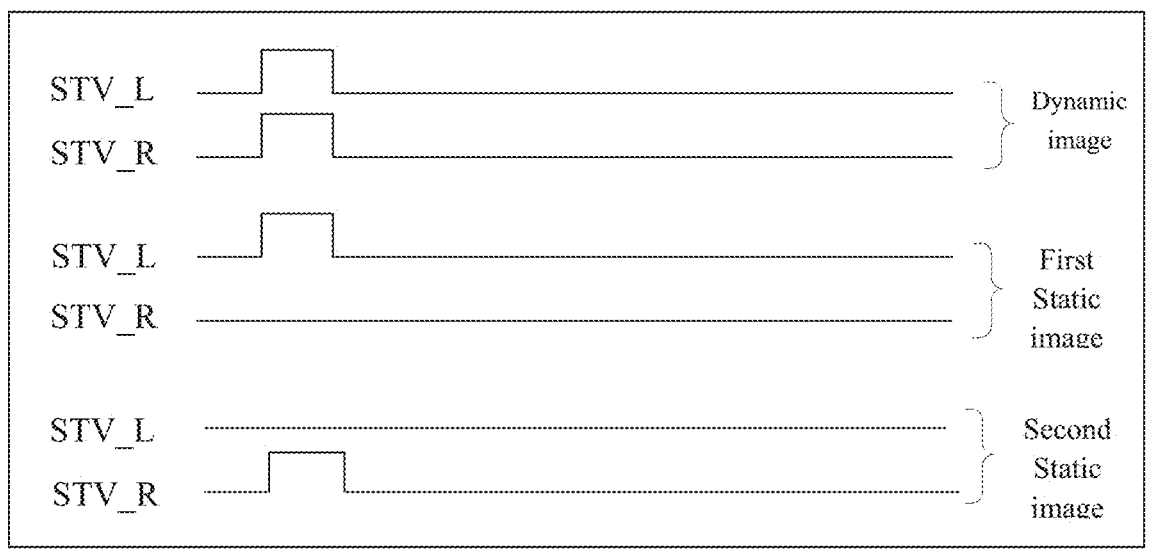
FIG. 4 is a waveform diagram of a start control signal outputted by the timing control circuit in FIG. 3 when a dynamic image and a static image are displayed, respectively.

Please refer to FIG. 4, which is a waveform diagram of a start control signal outputted by the timing control circuit in FIG. 3 when a dynamic image and a static image are displayed, respectively. When a static image is displayed, the timing controller 13 controls one of the first switch transistor T1 and the fourth switch transistor T4 to be turned on at intervals so that one of the fourth switch transistor T4 and the first switch transistor T1 outputs the start control signal, and the other of the fourth switch transistor T4 and the first switch transistor T1 stops outputting the start control signal. When the first switch transistor T1 is turned on, the second switch transistor T2 is synchronously turned off. When the fourth switch transistor T4 is turned on, the third switch transistor T3 is turned off synchronously. It should be understood that when the fourth switch transistor T4 is turned on, the first start control signal STV_L is correspondingly output. When the first switch transistor T1 is turned on, the second start control signal STV_R is correspondingly output.

When the timing controller 132 controls the first switch transistor T1 to be turned on, the corresponding second switch transistor T2 is synchronously turned off. The second terminal of the first switch transistor T1 is electrically connected to the start signal generating unit 131, the start control signal outputted by the start signal generating unit 131 is outputted through the first switch transistor T1 (referred to as the second start control signal STV_R in this case) to the second scan driver circuit 11b, so that the second scan driver circuit 11b outputs a scan signal to the second group of switches 102, and the TFT switches in the second group of switches 102 are turned on, at which time a second static image is displayed.

When the first switch transistor T1 is turned on, the fourth switch transistor T4 is turned off, and the third switch transistor T3 is synchronously turned on. The second terminal of the fourth switch transistor T4 cannot be electrically connected to the start signal generating unit 131, so that the start control signal outputted from the start signal generating unit 131 cannot be outputted to the first scan driver circuit 11a through the fourth switch transistor T4. Because the third switch transistor T3 is turned on, the second terminal of the fourth switch transistor T4 is pulled down to a low potential, thereby preventing the first scan driver circuit 11a from outputting a scan signal to the first group of switches 101, and therefore the TFT switch in the first group of switches 101 is turned off, thereby reducing power consumption.

After the first switch transistor T1 is turned on for a preset period of time, the timing controller 132 controls the first switch transistor T1 to be turned off, and simultaneously controls the fourth switch transistor T4 to be turned on, the corresponding second switch transistor T2 to be turned on, and the third switch transistor T3 to be turned off. At this time, the start control signal is outputted (referred to as the second start control signal STV_L in this case) to the first scan driver circuit 11a through the fourth switch transistor T4, so that the TFT switch in the first group of switches 101 is turned on. At the same time, the start control signal cannot be output to the second scan driver circuit 11b through the first switch transistor T1, so that the TFT switch in the second group of switches 102 is turned off, thereby reducing power consumption, and the first static image is displayed at this time. It should be noted that both the first static image and the second static image are images formed according to different groups of TFT switches at different times.

Therefore, when it is necessary to display a static image, the circuit arrangement of the timing control circuit 13 in this embodiment is such that one of the first group of switches 101 or the second group of switches 102 is controlled to be turned on and the other is turned off at the same time, thereby reducing power consumption at the time of displaying a static image. Because there is always a group of switches in a refreshing state when displaying the static image, the problem of leakage caused by the TFT switch not being refreshed all the time, thus damaging the display image quality, is avoided. Therefore, the embodiment effectively reduces the power consumption when displaying the static image on the premise of ensuring the display image quality.

Further, when the dynamic image is displayed, the timing controller 132 controls both the first switch transistor T1 and the fourth switch transistor T4 to be turned on, and controls both the second switch transistor T2 and the third switch transistor T3 to be turned off, so that the first start control signal STV_L outputted from the fourth switch transistor T4 is synchronized with the second start control signal STV_R outputted from the first switch transistor T1, and the refresh of the entire row of TFT switches is normally performed.

Specifically, when a dynamic image is displayed, as the data signal is continuously in a changing state, therefore, all TFT switches need to be refreshed continuously. The timing controller 132 therefore controls both the first switch transistor T1 and the fourth switch transistor T4 to be turned on, so that the timing control signal outputted by the start signal generating unit 131 is sent to the first scan driver circuit 11a and the second scan driver circuit 11b through the first switch transistor T1 and the fourth switch transistor T4, respectively, and then both the first group of switches 101 and the second group of switches 102 are turned on, thereby achieving the input of data signals.

Second Embodiment

Figure 5:
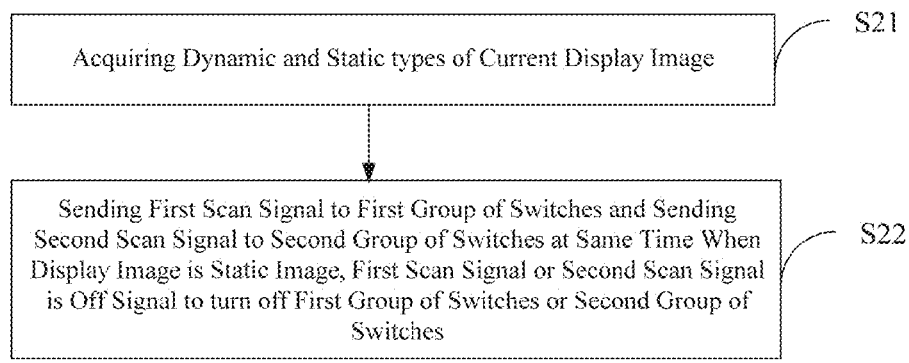
FIG. 5 is a flowchart of a control method of an array substrate in a second embodiment.

Please refer to FIG. 5, which is a flowchart of a control method of an array substrate in a second embodiment. An embodiment provides a control method of an array substrate 100. The array substrate 100 includes a plurality of TFT switches arranged in arrays. In each row of TFT switches, a plurality of TFT switches constitute a first group of switches 101, and the remaining TFT switches constitute a second group of switches 102. The method includes:

S21, acquiring a dynamic and static types of a current display image;

S22, sending a first scan signal to a first group of switches 101 and sending a second scan signal to a second group of switches 102 at the same time when the display image is a static image, wherein the first scan signal or the second scan signal is an off signal to turn off the first group of switches 101 or the second group of switches 102.

The first scan signal and the second scan signal are described in detail with reference to the above-mentioned first embodiment and will not be described here.

Third Embodiment

Figure 6:
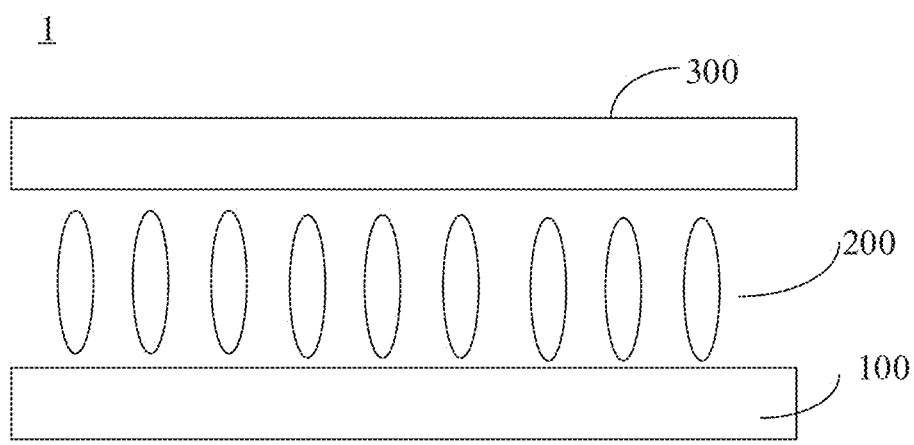
FIG. 6 is a partial structural diagram of a display panel in a third embodiment.

Reference is made to FIG. 6, which is a partial structural diagram of a display panel 1 in a third embodiment.

This embodiment provides a display panel 1, which includes a color film substrate 300 and the array substrate 100 as described in the first embodiment and a liquid crystal layer 200 sandwiched between the two substrates. The color film substrate 300 and the array substrate 100 are arranged by cell assembling. A scan driver circuit and a data driver circuit 12 both are connected to TFT switches on the array substrate 100.

Since the display device 1 of this embodiment has the array substrate 100 of the first embodiment, it has all the beneficial effects of the array substrate 100 and will not be described here.

While the present application has been described with reference to several exemplary embodiments, it should be understood that the terms used herein are illustrative and exemplary and are not limiting. Since the present application can be embodied in various forms without departing from the spirit or essence of the invention, it should therefore be understood that the foregoing embodiments are not limited to any of the foregoing details, but are to be interpreted broadly within the spirit and scope defined by the appended claims, so that all variations and modifications falling within the scope of the claims or their equivalents are to be covered by the appended claims.

What is claimed is:

1. An array substrate comprising:
   a plurality of TFT switches arranged in an array, wherein in each row of the TFT switches, a plurality of the TFT switches form a first group of switches, and a remainder of the TFT switches form a second group of switches; and
   a scan driver circuit outputting a first scan signal and a second scan signal corresponding to each row of the TFT switches;
   wherein the first group of switches receives the first scan signal, and the second group of switches receives the second scan signal, and wherein the first scan signal or the second scan signal is an off signal to turn off the first group of switches or the second group of switches, when a static image is displayed.

2. The array substrate according to claim 1, wherein M+N TFT switches are provided in each row, and along an arrangement direction of the TFT switches in each row, a front M TFT switches constitute the first group of switches, and a rear N TFT switches constitute the second group of switches.

3. The array substrate according to claim 1, wherein each row of the TFT switches is correspondingly provided with a first scan driver circuit and a second scan driver circuit, wherein the array substrate further comprises a timing control circuit;
   wherein the timing control circuit is connected to the first scan driver circuit to control the first scan driver circuit to output the first scan signal; and
   wherein the timing control circuit is connected to the second scan driver circuit to control the second scan driver circuit to output the second scan signal.

4. The array substrate according to claim 3, wherein the timing control circuit comprises a timing controller, a starting signal generating unit, a first switch transistor, a second switch transistor, a third switch transistor and a fourth switch transistor;
   wherein controlled ends of the first switch transistor, the second switch transistor, the third switch transistor and the fourth switch transistor are electrically connected to the timing controller, wherein a first terminal of the first switch transistor is connected to the start signal generating unit, and a second terminal of the first switch transistor outputs a first start control signal to the second scan driver circuit, wherein a first terminal of the second switch transistor is connected to the second terminal of the first switch transistor, and a second terminal of the second switch transistor is grounded;
   wherein a first terminal of the fourth switch transistor is connected to the start signal generating unit, and a second terminal of the fourth switch transistor outputs a first start control signal to the first scan driver circuit, wherein a first terminal of the third switch transistor is connected to the second terminal of the fourth switch transistor, and a second terminal of the third switch transistor is grounded;
   wherein a polarity of the first switch transistor is the same as a polarity of the fourth switch transistor and is opposite to a polarity of the second switch transistor, wherein the polarity of the fourth switch transistor is opposite to a polarity of the third switch transistor.

5. The array substrate according to claim 4, wherein the first switch transistor and the fourth switch transistor are NMOS transistors, and the second switch transistor and the third switch transistor are PMOS transistors.

6. The array substrate according to claim 5, wherein when a static image is displayed, the timing controller controls one of the first switch transistor and the fourth switch transistor to be turned on at intervals so that one of the fourth switch transistor and the first switch transistor outputs a start control signal, and another of the fourth switch transistor and the first switch transistor stops outputting the start control signal;
   wherein when the first switch transistor is turned on, the second switch transistor is turned off synchronously, and when the fourth switch transistor is turned on, the third switch transistor is turned off synchronously.

7. The array substrate according to claim 4, wherein when a dynamic image is displayed, the timing controller controls both the first switch transistor and the fourth switch transistor to be turned on, and controls both the second switch transistor and the third switch transistor to be turned off, to synchronize the first start control signal outputted by the fourth switch transistor with the second start control signal outputted by the first switch transistor.

8. The array substrate according to claim 4, wherein when the first scan driver circuit is a first gate driver circuit and the second scan driver circuit is a second gate driver circuit, the first gate driver circuit and the second gate driver circuit each comprises a level boost circuit;
   wherein the level boost circuit of the first gate driver circuit is connected to the second terminal of the fourth switch transistor to receive the first start control signal; and
   wherein the level boost circuit of the second gate driver circuit is connected to the second terminal of the first switch transistor to receive the second start control signal.

9. A control method of an array substrate comprising a plurality of TFT switches arranged in an array, wherein in each row of the TFT switches, a plurality of the TFT switches form a first group of switches, and a remainder of the TFT switches form a second group of switches, wherein the method comprises:
   acquiring a dynamic and static types of a current display image; and
   sending a first scan signal to a first group of switches and sending a second scan signal to a second group of switches at a same time when the display image is a static image, and wherein the first scan signal or the second scan signal is an off signal to turn off the first group of switches or the second group of switches.

10. A display panel comprising:
   a color film substrate;
   an array substrate, wherein the color film substrate and the array substrate are arranged by cell assembling, wherein the array substrate comprises:
      a plurality of TFT switches arranged in an array, wherein in each row of the TFT switches, a plurality of the TFT switches form a first group of switches, and a remainder of the TFT switches form a second group of switches; and
      a scan driver circuit outputting a first scan signal and a second scan signal corresponding to each row of the TFT switches;
      wherein the first group of switches receives the first scan signal, and the second group of switches receives the second scan signal, and wherein the first scan signal or the second scan signal is an off signal to turn off the first group of switches or the second group of switches, when a static image is displayed; and a liquid crystal layer sandwiched between the color film substrate and the array substrate.

11. The display panel according to claim 10, wherein M+N TFT switches are provided in each row, and along an arrangement direction of the TFT switches in each row, a front M TFT switches constitute the first group of switches, and a rear N TFT switches constitute the second group of switches.

12. The display panel according to claim 10, wherein each row of the TFT switches is correspondingly provided with a first scan driver circuit and a second scan driver circuit, wherein the array substrate further comprises a timing control circuit, wherein the timing control circuit is connected to the first scan driver circuit to control the first scan driver circuit to output the first scan signal, and wherein the timing control circuit is connected to the second scan driver circuit to control the second scan driver circuit to output the second scan signal.

13. The display panel according to claim 12, wherein the timing control circuit comprises a timing controller, a starting signal generating unit, a first switch transistor, a second switch transistor, a third switch transistor and a fourth switch transistor;

wherein controlled ends of the first switch transistor, the second switch transistor, the third switch transistor and the fourth switch transistor are electrically connected to the timing controller, wherein a first terminal of the first switch transistor is connected to the start signal generating unit, and a second terminal of the first switch transistor outputs a first start control signal to the second scan driver circuit, wherein a first terminal of the second switch transistor is connected to the second terminal of the first switch transistor, and a second terminal of the second switch transistor is grounded;

wherein a first terminal of the fourth switch transistor is connected to the start signal generating unit, and a second terminal of the fourth switch transistor outputs a first start control signal to the first scan driver circuit, wherein a first terminal of the third switch transistor is connected to the second terminal of the fourth switch transistor, and a second terminal of the third switch transistor is grounded;

wherein a polarity of the first switch transistor is the same as a polarity of the fourth switch transistor and is opposite to a polarity of the second switch transistor, wherein the polarity of the fourth switch transistor is opposite to a polarity of the third switch transistor.

14. The display panel according to claim 13, wherein the first switch transistor and the fourth switch transistor are NMOS transistors, and the second switch transistor and the third switch transistor are PMOS transistors.

15. The display panel according to claim 14, wherein when a static image is displayed, the timing controller controls one of the first switch transistor and the fourth switch transistor to be turned on at intervals so that one of the fourth switch transistor and the first switch transistor outputs a start control signal, and another of the fourth switch transistor and the first switch transistor stops outputting the start control signal;

wherein when the first switch transistor is turned on, the second switch transistor is turned off synchronously, and when the fourth switch transistor is turned on, the third switch transistor is turned off synchronously.

16. The display panel according to claim 13, wherein when a dynamic image is displayed, the timing controller controls both the first switch transistor and the fourth switch transistor to be turned on, and controls both the second switch transistor and the third switch transistor to be turned off, to synchronize the first start control signal outputted by the fourth switch transistor with the second start control signal outputted by the first switch transistor.

17. The display panel according to claim 13, wherein when the first scan driver circuit is a first gate driver circuit and the second scan driver circuit is a second gate driver circuit, the first gate driver circuit and the second gate driver circuit each comprises a level boost circuit;

wherein the level boost circuit of the first gate driver circuit is connected to the second terminal of the fourth switch transistor to receive the first start control signal; and wherein the level boost circuit of the second gate driver circuit is connected to the second terminal of the first switch transistor to receive the second start control signal.

* * * * *